United States Patent
Bauer et al.

(10) Patent No.: US 9,685,930 B2
(45) Date of Patent: Jun. 20, 2017

(54) BROAD-BAND FILTER IN BRANCHING TECHNOLOGY

(71) Applicant: Snaptrack Inc., San Diego, CA (US)

(72) Inventors: Thomas Bauer, München (DE); Andreas Bergmann, Haiming (DE)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 14/760,184

(22) PCT Filed: Dec. 5, 2013

(86) PCT No.: PCT/EP2013/075674
§ 371 (c)(1),
(2) Date: Jul. 9, 2015

(87) PCT Pub. No.: WO2014/108254
PCT Pub. Date: Jul. 17, 2014

(65) Prior Publication Data
US 2015/0349748 A1    Dec. 3, 2015

(30) Foreign Application Priority Data

Jan. 11, 2013 (DE) .................... 10 2013 100 286

(51) Int. Cl.
*H03H 9/54* (2006.01)
*H03H 9/64* (2006.01)
(Continued)

(52) U.S. Cl.
CPC ............ *H03H 9/542* (2013.01); *H03H 9/568* (2013.01); *H03H 9/605* (2013.01); *H03H 9/6483* (2013.01)

(58) Field of Classification Search
CPC ........ H03H 9/542; H03H 9/568; H03H 9/605; H03H 9/6483
(Continued)

(56) References Cited

U.S. PATENT DOCUMENTS 4,328,472 A *  5/1982  Grudkowski ...... H03H 9/02787
                                                    333/141
5,202,652 A     4/1993  Tabuchi et al.
(Continued)

FOREIGN PATENT DOCUMENTS

EP        0422637 A2    4/1991
EP        0541284 A1   10/1992
(Continued)

OTHER PUBLICATIONS

Hikita, M., et al., "Design Methodology and Synthesis Techniques for Ladder-Type Saw Resonator Coupled Filters," IEEE Ultrasonics Symposium, Oct. 31- Nov. 3, 1993, pp. 15-24.

*Primary Examiner* — Barbara Summons

(57) ABSTRACT

A reactance filter can be use branching technology. A series circuit contains a first filter element, a second filter element and a third filter element. Each filter element includes a first impedance element that is connected in series with an impedance element of an adjacent element. Each filter element also includes a second element connected to the first impedance element of that filter. The first and/or second impedance element of each filter element comprises a includes a resonator. Each impedance element has a bandwidth that is expressed by its pole zero distance and each filter element comprises a means for setting the bandwidths of the impedance elements.

18 Claims, 4 Drawing Sheets

(51) Int. Cl.
*H03H 9/56* (2006.01)
*H03H 9/60* (2006.01)

(58) Field of Classification Search
USPC .................................. 333/189, 193–195, 133
See application file for complete search history.

(56) References Cited

U.S. PATENT DOCUMENTS

| | | | |
|---|---|---|---|
| 5,471,178 A | 11/1995 | Hickernell | |
| 5,559,481 A | 9/1996 | Satoh et al. | |
| 5,726,610 A * | 3/1998 | Allen | H03H 9/6483 |
| | | | 310/313 B |
| 5,933,062 A * | 8/1999 | Kommrusch | H03H 9/6483 |
| | | | 310/313 B |
| 6,377,136 B1 * | 4/2002 | Rittenhouse | H03H 9/0561 |
| | | | 310/321 |
| 6,424,238 B1 * | 7/2002 | Penunuri | H03H 9/605 |
| | | | 333/187 |
| 6,480,075 B1 * | 11/2002 | Fujita | H03H 9/6483 |
| | | | 333/193 |
| 6,593,678 B1 * | 7/2003 | Flowers | H03H 9/0542 |
| | | | 310/313 R |
| 6,653,913 B2 | 11/2003 | Klee | H03H 3/04 |
| | | | 333/188 |
| 7,135,940 B2 * | 11/2006 | Kawakubo | H03H 9/542 |
| | | | 333/17.1 |
| 7,262,676 B2 * | 8/2007 | Ruile | H03H 9/02228 |
| | | | 257/E23.011 |
| 7,956,705 B2 * | 6/2011 | Meister | H03H 9/0095 |
| | | | 333/189 |
| 8,076,999 B2 * | 12/2011 | Schmidhammer | H03H 9/172 |
| | | | 333/187 |
| 8,283,835 B2 * | 10/2012 | Metzger | H03H 3/02 |
| | | | 310/313 A |
| 8,471,652 B2 * | 6/2013 | Meister | H03H 9/02228 |
| | | | 29/25.35 |
| 2004/0227587 A1 | 11/2004 | Inoue et al. | |
| 2007/0115079 A1 | 5/2007 | Kubo et al. | |
| 2008/0129418 A1 | 6/2008 | Miura et al. | |
| 2008/0252397 A1 | 10/2008 | Stuebing et al. | |
| 2012/0038244 A1 | 2/2012 | Wada et al. | |
| 2013/0162368 A1 | 6/2013 | Tsurunari et al. | |
| 2013/0170405 A1 * | 7/2013 | Yan | H03H 9/02015 |
| | | | 370/277 |
| 2014/0088287 A1 | 3/2014 | Nishimura et al. | |

FOREIGN PATENT DOCUMENTS

| | | |
|---|---|---|
| EP | 1 126 604 A2 * | 8/2001 |
| EP | 0750394 B1 | 10/2001 |
| EP | 1478091 A2 | 11/2004 |
| JP | H03205908 A | 9/1991 |
| JP | H05183380 A | 7/1993 |
| JP | H0837438 A | 2/1996 |
| JP | H0865089 A | 3/1996 |
| JP | 2000196409 A | 7/2000 |
| JP | 2004343168 A | 12/2004 |
| JP | 2008109413 A | 5/2008 |
| JP | 2012065304 A | 3/2012 |
| JP | 2012119928 A | 6/2012 |
| JP | 5559481 B2 | 7/2014 |
| JP | 5726610 B2 | 6/2015 |
| WO | 2006008940 A1 | 1/2006 |
| WO | 2011142183 A1 | 11/2011 |
| WO | 2012176455 A1 | 12/2012 |
| WO | 2013128636 A1 | 9/2013 |

\* cited by examiner

BROAD-BAND FILTER IN BRANCHING TECHNOLOGY

This patent application is a national phase filing under section 371 of PCT/EP2013/075674, filed Dec. 5, 2013, which claims the priority of German patent application 10 2013 100 286.2, filed Jan. 11, 2013, each of which is incorporated herein by reference in its entirety.

TECHNICAL FIELD

The present invention relates to a broad-band filter.

BACKGROUND

The current mobile radio standard LTE has mobile radio bands defined for it that are coincident with known frequency bands and are distinguished merely by increased bandwidth. Thus, by way of example, LTE band 26 with 35 MHz of bandwidth (i.e., uplink 814 MHz-849 MHz and downlink 859 MHz-894 MHz) corresponds to band 5 defined for WCDMA with 25 MHz of bandwidth (i.e., uplink 824 MHz-849 MHz and downlink 869 MHz-894 MHz), that is 10 MHz wider in comparison therewith. The higher bandwidth decreases the transition bandwidth between the transmission band TX and the reception band RX. This results in increased demands on the frequency accuracy and therefore necessitates a filter with a very steep edge.

Furthermore, there is a need for wider bands in order to comply with new and future transmission techniques in advance. For the aforementioned LTE band 26, no filter solutions for extended bandwidths are known to date, which means that the bands are usually split and are served by two different filters.

In general, it is known practice to manufacture broadband reactance filters using branching technology and to use broadband resonators as well. However, this regularly results in the disadvantage that in a filter with increasing bandwidth the edges of the passband become shallower and thus result in excessive transition bandwidths. Such filters are then no longer suitable for mobile radio bands that have a short spacing from the adjacent band of the same transmission standard, such as the cited LTE band 26.

European Patent No. 0750394 B1 proposes modifying a branching filter, which is in the form of a ladder-type filter with SAW resonators (SAW=surface acoustic wave), such that one type of the resonators, selected from parallel and series resonators, is provided with relatively low coupling by means of a dielectric layer deposited above the resonators. This results in a filter having a higher bandwidth. At the same time, one of the two passband edges remains unaltered and meets the requirements for gradient. The other passband edge flattens out, on the other hand, and therefore exhibits an increased transition bandwidth.

SUMMARY

Embodiments of the present invention specify a filter using branching technology that has a sufficiently high bandwidth but that quickly changes to the stop band and hence has a low transition bandwidth.

It has been found that a branching filter that comprises a series circuit containing three filter elements solves the problem.

The reactance filter comprises series-connected and parallel-connected impedance elements. The impedance elements each comprise a resonator, a series circuit containing a resonator and a series coil or a parallel circuit containing a resonator and a capacitance. Each filter element comprises at least one impedance element. Each impedance element has a bandwidth that is expressed by its pole zero distance. In order to achieve the desired effect, a bandwidth means is used to set the bandwidth of the impedance elements in the filter elements differently.

Preferably, the bandwidths of the impedance elements of that filter element that is arranged centrally in the series circuit are set to a different value than those of the first and third filter elements.

The bandwidth of a resonator is understood to mean the pole zero distance of the resonator, that is to say the frequency spacing between the (principal) resonance and the antiresonance. The bandwidth of an impedance element can also be defined in precisely this manner. The bandwidth of a filter or filter element, on the other hand, can also be ascertained from the width of the passband, with the spacing between those points on the transmission curve at which the signal has an attenuation of 6 dB, for example, in comparison with the maximum value being chosen in general.

A filter element whose impedance elements have an increased or decreased bandwidth then also itself has an increased or decreased bandwidth. A reactance filter for which the relationship established for the impedance elements of the filter elements in terms of bandwidth is also satisfied for the filter elements likewise achieves the object according to the invention therefore. In that case, the bandwidth of the middle filter element is set differently by a bandwidth means than in the first and third filter elements.

The bandwidth means used may be measures that directly influence the bandwidth of the resonators. Alternatively, bandwidth means may be circuit means that increase the bandwidth of the filter element for a given bandwidth of the resonators of a filter element. This is achieved by impedance elements that comprise a resonator connected up to a series coil or a parallel capacitance.

In one embodiment, the bandwidth of the impedance elements of the second filter element is set differently than the bandwidth of the impedance elements of the first and third filter elements.

A filter formed in this manner achieves bandwidths of 6% or more for a transition bandwidth for 5 MHz on both sides of the passband. Hence, this filter has good suitability for the LTE band 26 cited at the outset. Attempts to model the same filter properties with just two filter elements have surprisingly failed, which means that it is imperative to provide a series circuit containing three filter elements in which the middle filter element differs in terms of bandwidth from the first and second filter elements.

In this case, it is possible for the impedance elements of the second filter element to have a lower bandwidth than those of the first and third filter elements. Conversely, it is also possible for the impedance elements of the second filter element to have a higher bandwidth than those of the first and third filter elements. The bandwidths of the impedance elements of the first and third filter elements may be the same.

It can be seen that the desired filter properties are all the more pronounced the greater the extent to which the bandwidths of the impedance elements in the filter elements differ. An effect is observed just for small differences, however.

Depending on the aim of optimization, suitable bandwidth means allow particularly narrowband impedance elements in a filter element to be combined with two filter elements having broadband impedance elements in order to achieve steep passband edges. Alternatively, the bandwidth of the impedance elements of one or two filter elements is set to a maximum value without simultaneously reducing the bandwidth of the impedance elements of the remaining filter element too greatly in the process. Hence, a reactance filter is obtained that is distinguished by a particular broadband nature. Specific filter properties therefore require a tradeoff between the two measures.

Resonators used for the branching filter may be acoustic wave resonators. Such resonators may be selected from SAW resonators (SAW=Surface Acoustic Wave), BAW resonators (BAW=Bulk Acoustic Wave) and GBAW resonators (GBAW=Guided Bulk Acoustic Wave).

For the purpose of shaping the bandwidth, which may be increased or decreased in one filter element in comparison with another filter element, it is possible for the bandwidth means to be a coil connected in series with the relevant filter element in order to increase the bandwidth. In one embodiment, the branching filter therefore contains a filter element with increased bandwidth, in the case of which the bandwidth means is a series resonator connected in series with a coil. The high inductance of the coil that is necessary for this bandwidth means usually requires a separate coil, that is to say a discrete component that has a sufficiently high quality. Impedance elements in the form of a resonator connected in series with a series coil can be used at arbitrary points in the reactance filter as a series or parallel impedance element.

A further bandwidth means consists in the provision of a second different substrate on which one or two of the filter elements of the series circuit are formed. The selection of the suitable substrate for setting the bandwidth of impedance elements or filter elements produced thereon is made such that achieving a higher bandwidth in the impedance elements involves the substrate of the corresponding filter element or of the impedance elements having a higher level of coupling than the substrate for the remaining filter element(s) or impedance element(s).

Piezoelectric substrates on which the acoustic wave resonators are formed have substrate-specific coupling that increases monotonously with bandwidth. A plausible definition of the coupling via the relative pole zero distance pzd (normalized to the resonant frequency of the resonator) would be:

$$k^2=0.25*\pi^2*pzd/(1+pzd)$$

In a preferred embodiment, the second filter element is therefore formed on a substrate material having a first electromechanical coupling constant, which is a measure of the coupling, and the first and third filter elements are, by contrast, formed on a second substrate material having another, second electromechanical coupling constant. Preferably, the second electromechanical coupling constant is greater than the first electromechanical coupling constant.

By way of example, quartz has a relatively low coupling constant. A relatively high coupling constant is achieved with lithium niobate substrates. Lithium tantalate substrates, on the other hand, have a medium coupling constant. Furthermore, for a given material it is possible to influence the coupling by means of the choice of suitable cutting angles. Depending on the level of the coupling ratio between the filter elements or the impedance elements of the filter elements, the corresponding substrates are selected. In this case, it is possible for the first and third filter elements to be set up on the same substrate and the same chip. In addition, it is possible for the first and third filter elements to be formed on the same substrate material, admittedly, but on separate chips.

In a further embodiment, the bandwidth means for decreasing the bandwidth of an impedance element, a filter element or a circuit branch of a filter element is a capacitance connected in parallel with a resonator. An effect is already obtained for the whole branching filter when single instances of the resonators are connected up to a capacitance. In one embodiment, all of the series resonators of the corresponding filter element are each connected in parallel with a capacitance.

In addition, the parallel resonators of the corresponding filter element can also each be connected in parallel with a capacitance. Impedance elements in the form of a resonator with a parallel capacitance can, in principle, be used in any series or parallel branches of the branching filter (reactance filter).

Connecting a capacitance in parallel with a resonator provides an impedance element having an increased capacitance ratio for static to dynamic capacitance, from which it is possible to directly compute the bandwidth, expressed as a normalized pole zero distance pzd, which in this case is reduced:

$$pzd=\sqrt{(1+1/r)}-1$$

The differently ascertained parameters electromechanical coupling, bandwidth and capacitance ratio between static and dynamic capacitance denote the same correlations and can be converted from one another into one another. Within the context of the invention, it is therefore of no importance whether the bandwidth, the electromechanical coupling or the capacitance ratio of an impedance element, a resonator or a filter element is altered, since all three cases involve the bandwidth being influenced in equal measure.

In a further embodiment, the bandwidth means is a dielectric layer arranged above the acoustic wave resonators in one or more filter elements. This succeeds in decreasing the coupling and hence the bandwidth of the resonator or of the filter element.

The extent to which the coupling or the bandwidth is varied increases usually monotonously with the layer thickness of the dielectric layer. The mechanical properties of the dielectric layer also make a greater impression on the piezoelectric substrate material as layer thickness increases.

In one embodiment, the dielectric layer is an $SiO_2$ layer arranged above the resonators of a filter element in order to decrease the electromechanical coupling. Since a dielectric layer of this kind simultaneously has a temperature coefficient TCF for the frequency whose arithmetic sign is opposite that of the TCF for most piezoelectric materials, this allows the effective temperature coefficient for the frequency of the filter element to be decreased and/or even compensated for entirely.

In a preferred embodiment, the first, second and third filter elements are provided with a dielectric layer, particularly an $SiO_2$ layer, wherein the layer thicknesses of the $SiO_2$ layer in the first and third filter elements are set lower than in the second filter element. This embodiment can be combined with production of the filter on two separate chips (second filter element on a separate chip), it being possible for the same or different substrate material to be used for the two chips. It is also advantageous for an additional dielectric layer to be applied to the $SiO_2$ layer for the purpose of passivation, e.g., from SiN.

According to one embodiment, the filter using branching technology comprises resonators that use acoustic waves.

The first and third filter elements are formed on a first chip, whereas the second filter element is formed on a second chip. The first and second chips each have a different coupling set for the impedance elements. Both chips are arranged on a common circuit carrier and connected up in series via electrical conductor sections of the circuit carrier.

Along with the circuit carrier, the two chips are packaged together, that is to say accommodated in a common package. Preferably, packaging involves the use of encapsulation that is in close contact with the chips and the circuit carrier and seals a cavity holding the two chips but is indispensable for interference-free operation of the acoustic wave resonators or of the whole filter.

This two-chip solution lends itself in all the cases in which the use of bandwidth means cannot otherwise be limited to individual filter elements; particularly when the bandwidth means chosen are different substrate materials or when the resonators are covered with different layers, the two-chip solution lends itself as an advantageous refinement.

It is also possible for the filter to be constructed from two chips that each carry resonators of a filter element, with different resonator technologies being used for different filter elements. According to a refinement, BAW resonators are used for the filter elements having low bandwidth while SAW resonators are used for the resonators having the higher bandwidth. Such a split has the advantage that BAW resonators currently have lower bandwidths by nature and high bandwidths, as are required for achieving the object according to the invention, can be attained only with SAW resonators.

Resonators and/or filter elements having a different bandwidth can be set to an appropriate bandwidth not just using a single bandwidth means. It is also possible for a plurality of bandwidth means to be used simultaneously in order to attain greater differentiation between resonators having high and low bandwidth.

In one embodiment, two chips are used for the branching filters, said chips differing in at least two parameters that are selected from substrate material, cutting angle for the piezoelectric material, dielectric material, filter technology and layer thickness of the dielectric layer that is applied above the filter elements. Furthermore, it is also possible for additional bandwidth means to be used on the individual chips, particularly capacitances connected in parallel with the resonators. If the bandwidth means are combined such that the resultant effects are added constructively, the use of a plurality of bandwidth means allows far greater differentiation to be achieved between the filter element having different bandwidth.

In the extreme case, a filter element may be constructed from just one resonator or just one impedance element. However, it is also possible for a plurality of first and/or second resonators to be provided per filter element. One of the filter elements may consist of just one series or parallel resonator. According to one embodiment, the number of resonators in the first and third filter elements is the same. In this case, this number can also correspond to the number of resonators in the second filter element.

In addition, it is preferred for the connection sequence for the resonators in the first, second and third filter elements to be chosen such that the whole filter has a connection sequence for the resonators that is symmetrical around the circuit center. Connection sequence is understood to mean the order in which series resonators and circuit nodes, at which parallel branches containing parallel resonators branch, follow one another. The connection sequence does not have to match the geometric arrangement of the resonators on the chip(s).

BRIEF DESCRIPTION OF THE DRAWINGS

The invention is explained in more detail below using exemplary embodiments and the associated figures.

DETAILED DESCRIPTION OF ILLUSTRATIVE EMBODIMENTS

Figure 1A:
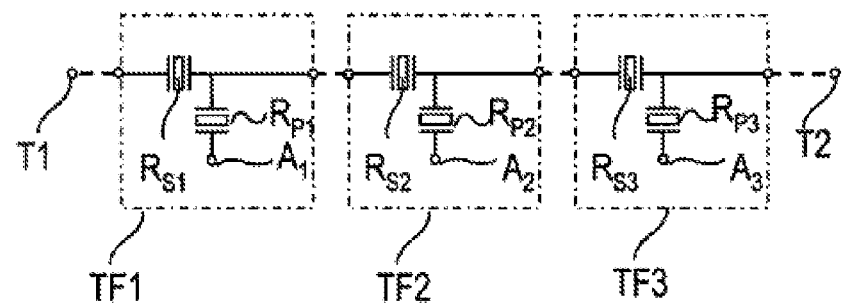
FIG. 1A shows a connection of three filter elements.

FIG. 1A shows a simple embodiment of a filter using branching technology that comprises a series interconnections containing a first filter element TF1, a second filter element TF2 and a third filter element TF3. Each of the filter elements comprises at least one series resonator $R_S$ and a parallel resonator $R_P$ connected in parallel therewith as impedance elements. The series resonators $R_S$ are connected up in a series path that connects a first connection T1 to a second connection T2. The parallel resonators $R_P$ are arranged in parallel paths that connect circuit nodes in the series path to a connection A (or A1, A2, A3) that is connected to a fixed potential, usually to ground potential.

In the exemplary embodiment shown, the second filter element or at least a series resonator of the second filter element TF2 is equipped with a bandwidth that differs from the bandwidth of the series resonators of the first and third filter elements TF3. In this case, the bandwidth of the series resonator(s) in the second filter element TF2 can be set above or below that of the resonators of the other two filter elements.

In the filter shown, the second filter element or at least a series resonator $R_{S2}$ of the second filter element TF2 is equipped with a bandwidth that differs from the bandwidth of the series resonators in the first and third filter elements. In this case, the bandwidth of the series resonator(s) in the second filter element can be set above or below that of the series resonators of the other two filter elements.

Figure 1B:
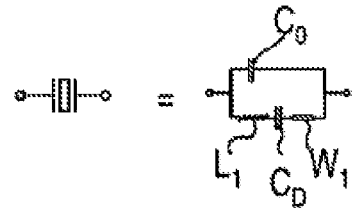
FIG. 1B shows the equivalent circuit diagram for a resonator.

FIG. 1B shows an equivalent circuit diagram for the resonators used in FIG. 1A. A resonator comprises a static capacitance $C_0$ connected in parallel with a series interconnection that comprise a first inductance L1, a dynamic capacitance CD and a resistor W1. In this case, the static capacitance $C_0$ corresponds to the capacitance that the resonator has at a frequency far above the resonant frequency.

Resonance is obtained in a frequency for which the values of the first inductance L1 and the dynamic capacitance CD meet the resonance conditions.

It is of no importance to the invention what technology is used to embody the individual resonators of the filter using branching technology. Different bandwidth means can be used depending on the resonator technology used, however.

Figure 2:
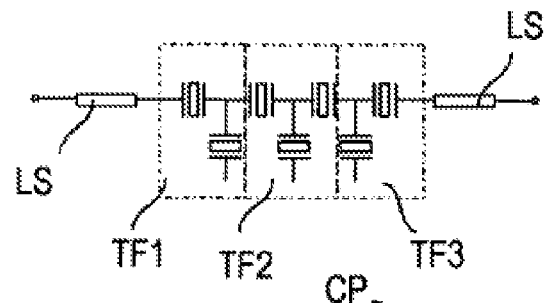
FIG. 2 shows a filter using branching technology that is connected up to coils.

FIG. 2 shows a filter using branching technology in which the first filter element TF1 and the third filter element TF3 are each connected up to a series coil $L_S$. The effect achieved by this is that the bandwidth of the first filter element TF1 and the bandwidth of the third filter element TF3 are increased. In general, connecting up a resonator as shown in FIG. 1B to a series coil to form an impedance element shifts the resonant frequency of the branch formed therefrom downward to a lower frequency, while the position of the antiresonance remains fixed. This increases the pole zero distance pzd of the branch. The second resonance on account of the coil, which additionally arises at very high frequencies, can be disregarded because it plays no part in the behavior of the filter close to the passband.

The series coils LS may be produced on the filter chip on which the resonators are also formed. However, it is also possible for the series coils to be produced on a substrate that carries at least one chip of the filter using branching technology. It is also possible for the series coils LS to be integrated in a multilayer substrate that carries one or more chips of the filter using branching technology.

In order to achieve high quality and a sufficiently high inductance value, coils embodied as discrete elements are preferred, however.

Figure 3:
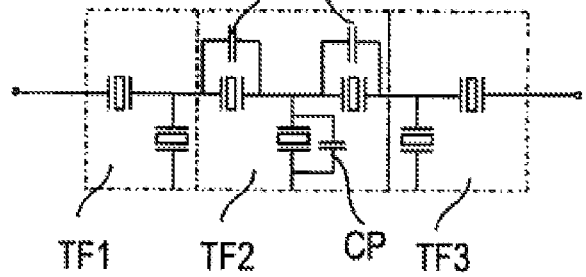
FIG. 3 shows a filter using branching technology that is connected up to capacitances.

FIG. 3 shows a filter using branching technology in which a capacitance CP is connected up in parallel with each of the two series resonators used here within the second filter element TF2. The effect achieved with this measure is that the bandwidth of the corresponding impedance elements or branches becomes lower. This can be attributed to the parallel capacitance being added to the static capacitance C0 of the resonator and hence increasing the capacitance ratio C0 to C1. By connecting a capacitance in parallel with a resonator as shown in FIG. 1B, the antiresonant frequency is shifted downward, while the resonant frequency remains uninfluenced. This reduces the pole zero distance pzd in this case. The parallel resonator(s) $R_P$ of the second filter element may also, as shown in FIG. 3, be connected up to a parallel capacitance. The result obtained is a filter using branching technology in which the bandwidth of the middle filter element is reduced in comparison with the first and third filter elements TF1, TF3.

However, it is also possible for at least the series resonators of the first and third filter elements to be connected up to a further parallel capacitance CP, whereas the series resonators of the second filter element are not. This provides a filter using branching technology in which the bandwidth of the first and third filter elements is reduced in comparison with the bandwidth of the second filter element TF2.

Figure 4:
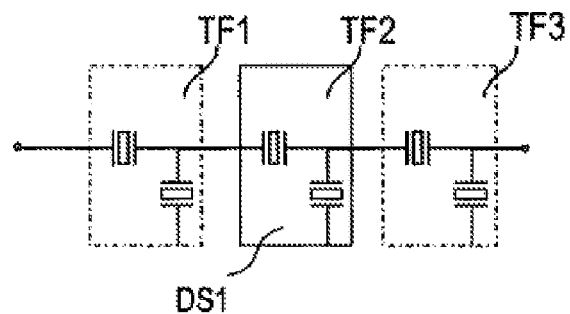
FIG. 4 shows a filter using branching technology that has the second filter element provided with a dielectric layer.

FIG. 4 shows a filter using branching technology in which a dielectric layer DS1 has been applied above the resonators of the second filter element TF2. Depending on the thickness of the layer, the bandwidth is either increased or reduced. The dielectric layer has been applied at least over the series resonators of the second filter element, but preferably over all resonators of the second filter element, which also includes the parallel resonators.

However, it is also possible for the circumstances shown in FIG. 4 to be reversed and for the first and third filter elements to be provided with a respective dielectric layer so as to increase or decrease the bandwidth of the first and third filter elements.

Figure 5:
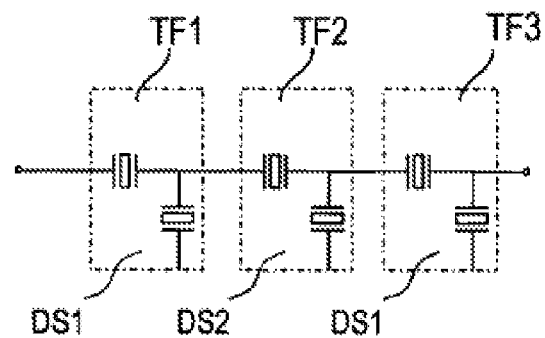
FIG. 5 shows a filter using branching technology that has the three filter elements provided with different dielectric layers.

FIG. 5 shows a further embodiment in which all three filter elements TF1 to TF3 are provided with a respective dielectric layer DS as bandwidth means.

For the layer thickness d2 of the dielectric layer DS2, which has been applied above the second filter element TF2, and the layer thickness d1 of the dielectric layer DS1, which has been applied above the resonators of the first and third filter elements, d1≠d2 applies. Both cases are possible: d1<d2 and d1>d2. In this situation, one of the two layer thicknesses may also be zero.

The extent to which the bandwidth is altered by the application of the dielectric layer is dependent on the layer thickness d of the dielectric layer. Different layer thicknesses above impedance elements or filter elements can therefore be used to set different bandwidths, even if using resonators that have the same bandwidth without the dielectric layer applied.

The stiffness of the dielectric layer may be greater or less than the stiffness of the piezoelectric material of the resonators. This determines the direction in which the properties of the respective impedance element shift.

Figure 6:
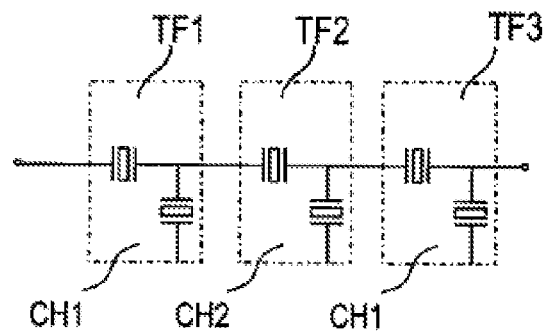
FIG. 6 shows a filter using branching technology that has the filter elements produced on at least two different chips.

FIG. 6 uses a further embodiment to show how the selection of the piezoelectric material of the resonators can be used as bandwidth means. The resonators of the first and third filter elements TF1, TF3 are formed on a first chip CH1 that comprises a first piezoelectric material. The resonators of the second filter element TF2 are formed on a second chip CH2, the piezoelectric material of which differs from that of the first chip CH1. The first and second chips may also have the same material but different cutting angles. The cutting angle or the piezoelectric material of the second chip CH2 may be selected such that impedance elements or resonators on the second chip have lower coupling than on the first chip CH1. However, it is also possible for the piezoelectric material of the second chip CH2 to be equipped with greater coupling than the material of the first chip CH1. In the first case, the second filter element becomes more narrowband than the first and third filter elements, while in the latter case the first and third filter elements become more narrowband than the second filter element.

The options shown in FIGS. 2 to 4 for varying the bandwidth of the second filter element or the bandwidth of the resonators of the second filter element in comparison with the bandwidth of the resonators of the first and third filter elements can also be combined with one another in order to boost the effect and to attain particularly great differentiation in the bandwidth between the first and second filter elements.

Figure 7:
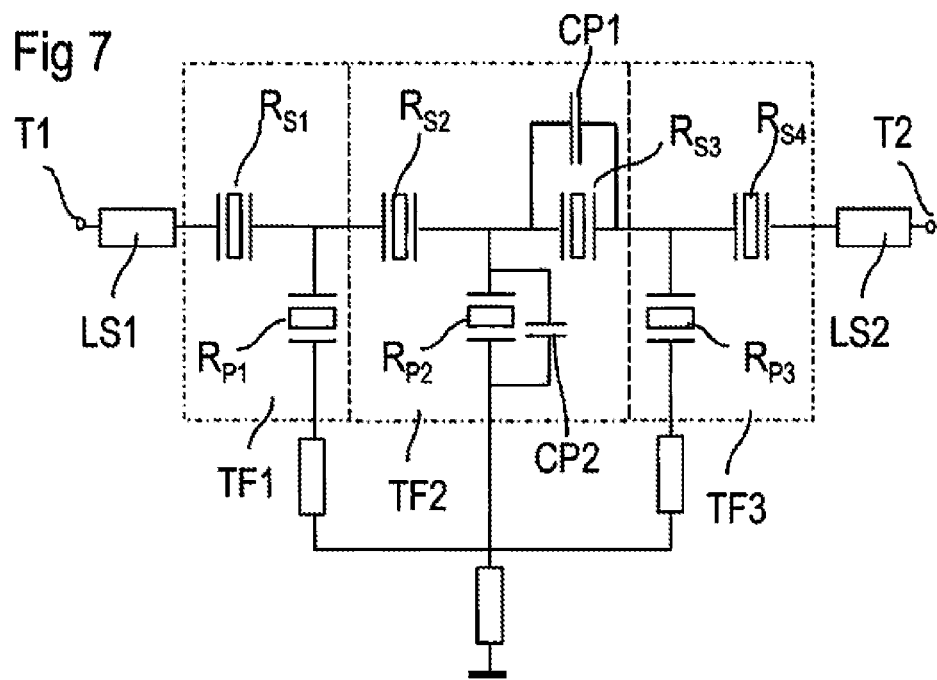
FIG. 7 shows a more complex exemplary embodiment of a filter using branching technology in which a plurality of bandwidth means are used.

FIG. 7 shows a more complex exemplary embodiment of this kind in which three measures for setting bandwidth are implemented. The filter comprises a first filter element TF1 with the series resonator RS1 and the parallel resonator RP1, a second filter element TF2 with the two series resonators RS2 and RS3 and the parallel resonator RP2 arranged in between, and a third filter element with the parallel resonator RP3 and the series resonator RS4. The sequence of the resonators is symmetrical. Connected up between a first terminal T1 and the first series resonator RS1 of the first filter element is a first series inductance LS1, which forms an impedance element having a relatively high bandwidth with the resonator RS1. A further series inductance LS3 is connected up between the second terminal T2 and the last series resonator RS4 of the third filter element, which series inductance with the resonator RS4.

Connected up in parallel with a series resonator RS3 of the second filter element is a first capacitance CP1 to form an impedance element. A further capacitance CP2 is connected in parallel with the parallel resonator RP2 of the second filter element and likewise forms an impedance element.

The parallel branches that contain the parallel resonators of the first to third filter elements are connected to a ground connection via a respective inductance, the ground connection being able to be connected to an external ground via a further inductance. These inductances may be in the form of supply line inductances, that is to say produced by the inductance of "normal" interconnects (supply lines). Higher inductance values can be produced by especially long supply lines, via which the resonators are connected to ground and which in turn form impedance elements with the resonators.

The figure does not show the dielectric layers DS1 and DS2 that have been applied above the acoustic resonators of the first to third filter elements such that the layer thickness of the dielectric layer above the resonators of the second filter element is set higher than above the resonators of the first and third filter elements. The material used for the dielectric layer is an $SiO_2$ layer, which simultaneously has the effect that it reduces or compensates for the temperature coefficient of the frequency (TCF) of the corresponding filter element. The higher layer thickness of the $SiO_2$ layer above the second filter element achieves better compensation for the TCF for this filter element, which is important particularly because in this embodiment the critical filter edges are produced primarily by the second filter element. A critical filter edge is the one that separates a passband of the filter from a closely adjacent further band. Consequently, three measures for setting bandwidth are implemented in the exemplary embodiment shown in FIG. 7, namely the series coil, the parallel capacitances and the dielectric layers of different thickness.

In the filter elements, the center frequencies of the series and parallel resonators can be chosen differently, as a result of which the bandwidth of the whole filter can be increased further. In addition, the resonators can be embodied such that they have different static capacitances C0. The capacitance values of the capacitances connected in parallel with the resonators can also be set differently.

In one exemplary embodiment, the variable parameters of the filter in FIG. 7 can be chosen as follows:

| Element | | | | | | | |
|---|---|---|---|---|---|---|---|
| | $R_{S1}$ | $R_{S2}$ | $R_{S3}$ | $R_{S4}$ | $R_{P1}$ | $R_{P2}$ | $R_{P3}$ |
| Resonant frequency (MHz) | 852 | 849 | 860 | 847 | 810 | 822 | 814 |
| Capacitance ratio $r = C_0/C_D$ | 12.5 | 14.6 | 14.6 | 12.5 | 12.5 | 14.6 | 12.5 |
| Layer thickness of the $SiO_2$ layer | L | H | H | L | L | H | L |

| Element | | |
|---|---|---|
| | $L_{S1}$ | $L_{S3}$ |
| Inductance (nH) | 2.9 | 2.9 |

| Element | | |
|---|---|---|
| | $C_{P1}$ | $C_{P2}$ |
| Capacitance (pF) | 2.5 | 0.91 |

Layer thickness H = high, layer thickness L = low

All the resonators of the second filter element have a capacitance ratio $r=C_0/C_D$ of 14.6 and hence a smaller bandwidth than the resonators of the first and third filter elements with a capacitance ratio of r=12.5. Formation of impedance elements with parallel capacitances in the second filter element TF2 reduces the bandwidths further, while the impedance elements of the first and third filter elements have series coils that increase the bandwidth further.

Figure 8:
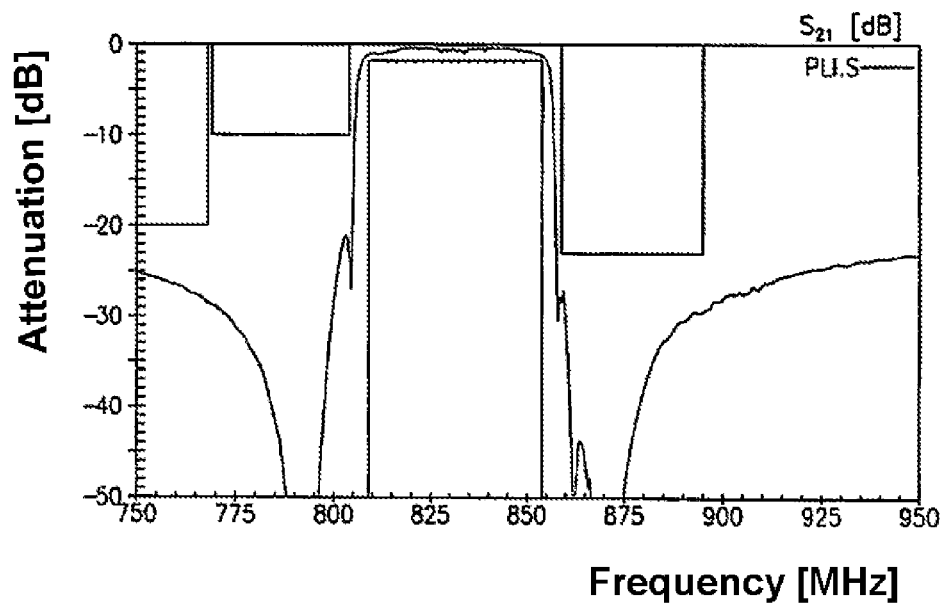
FIG. 8 shows the transfer function of the filter shown in FIG. 7 with first parameters.

FIG. 8 shows the transfer function of the filter shown in FIG. 7 with the indicated parameters using the value $S_{21}$. The filter has a bandwidth of 50 MHz at a center frequency of 840 MHz, which corresponds to a relative bandwidth of approximately 6%. The transition bandwidth within which the required rejection action is achieved in the region of the adjacent bands, particularly of the higher RX band of LTE band 26, is less than 5 MHz. Hence, the exemplary embodiment meets all the requirements for a band 26 TX filter, as demanded by the LTE standard. The first time that the implementation is successful is using SAW technology on a lithium niobate substrate. Further improvements are conceivable if the filter is constructed on two different piezoelectric chip substrates, with the substrate for the first and third filter elements then preferably having a higher coupling coefficient than the substrate for the second filter element.

In a further exemplary embodiment, other values are chosen for the impedance elements in FIG. 7. The following tables indicate the corresponding values in an exemplary embodiment:

| Element | | | | | | | |
|---|---|---|---|---|---|---|---|
| | $R_{S1}$ | $R_{S2}$ | $R_{S3}$ | $R_{S4}$ | $R_{P1}$ | $R_{P2}$ | $R_{P3}$ |
| Resonant frequency (MHz) | 840 | 834 | 841 | 836 | 795 | 805 | 798 |
| Capacitance ratio $R = C_-/C_D$ | 12.5 | 14.6 | 14.6 | 12.5 | 12.5 | 14.6 | 12.5 |
| Layer thickness of the $SiO_2$ layer | L | H | H | L | L | H | L |

| Element | | |
|---|---|---|
| | $L_{S1}$ | $L_{S3}$ |
| Inductance (nH) | 3 | 3 |

| Element | | |
|---|---|---|
| | $C_{P1}$ | $C_{P2}$ |
| Capacitance (pF) | 2.00 | 0.55 |

Layer thickness H = high, layer thickness L = low

Figure 9:
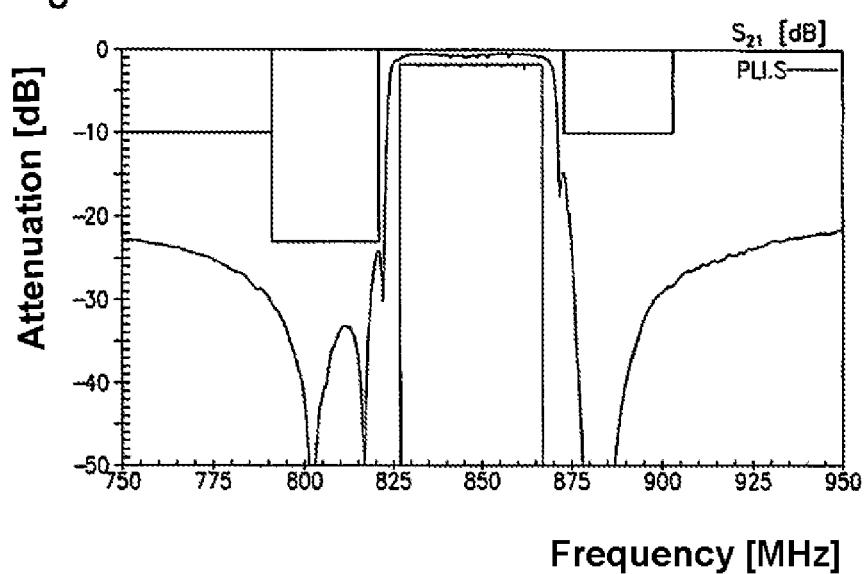
FIG. 9 shows the transfer function of the filter shown in FIG. 7 with second parameters.

FIG. 9 shows the transmission curve S21 for the filter shown in FIG. 7 with the parameters indicated above, which filter can be produced on a lithium niobate 127.85° XY substrate. In this case too, it can be seen that a high bandwidth of 40 MHz can be achieved at a center frequency of 847 MHz, which corresponds to a relative bandwidth of approximately 4.7%. In this case too, a low transition bandwidth in the region of 5 MHz is attained. The specifications attained allow the filter to be used for LTE band 20 and means that said filter even has a larger bandwidth in comparison therewith.

With basically similar interconnection but differently chosen center frequencies, the invention can also be used to produce filters for other bands and particularly for TX bands in any mobile radio standards that place high requirements on bandwidth and transition bandwidth.

The invention is not limited to the embodiments shown in the exemplary embodiments. The invention covers all filters using branching technology that have three filter elements connected up in series and for which the bandwidth of the second filter element differs from the bandwidth of the first and third filter elements. Further elements may be connected up between the two filter elements and between the filter elements and the external connections. The measures for reducing or increasing the bandwidth of the respective filter element can be combined in an arbitrary manner.

The invention claimed is:

1. A reactance filter using branching technology, the reactance filter comprising:
    a series circuit containing a first filter element, a second filter element and a third filter element,
    wherein each filter element comprises a first impedance element that is connected in series with an impedance element of an adjacent filter element,
    wherein the first impedance element of each filter element comprises a resonator,
    wherein each first impedance element has a bandwidth that is expressed by its pole zero distance,
    wherein each filter element comprises a means for setting a bandwidth of at least one impedance element thereof, the bandwidth of at least one of the first impedance elements in at least one of the filter elements being set to a different value than the bandwidth of at least one of the first impedance elements in another of the filter elements, and
    wherein the impedance elements of the second filter element have a lower bandwidth than those of the third filter element.

2. The reactance filter according to claim 1, wherein one or more of the filter elements comprises the resonator and a series coil.

3. The reactance filter according to claim 1, wherein one or more of the filter elements comprises the resonator and a parallel capacitance circuited in parallel to the resonator.

4. The reactance filter according to claim 1, wherein the bandwidths of all the impedance elements of the second filter element are set to be larger or narrower than the bandwidths of the impedance elements of the first element.

5. The reactance filter according to claim 1, wherein the resonators are acoustic wave resonators.

6. The reactance filter according to claim 5, wherein the acoustic wave resonators are selected from the group consisting of SAW (surface acoustic wave) resonators, BAW (bulk acoustic wave) resonators and GBAW (guided bulk acoustic wave) resonators.

7. The reactance filter according to claim 5, wherein the means for setting the bandwidth comprises a dielectric layer arranged above at least one of the acoustic wave resonators of the filter elements, wherein a layer thickness of the dielectric layer above the second filter element is set to a value different than a layer thickness of the dielectric layer above the first and third filter elements, and wherein the smaller layer thickness can have a value zero.

8. The reactance filter according to claim 7, wherein the dielectric layer in one of the filter elements sets a lower bandwidth for the impedance elements by having a greater stiffness at that location than a piezoelectric substrate of the resonators and a greater thickness than above another filter element.

9. The reactance filter according to claim 7, wherein the dielectric layer is an $SiO_2$ layer arranged above the resonators of at least one filter element.

10. The reactance filter according to claim 9, further comprising a SiN passivation layer arranged above the $SiO_2$ layer.

11. The reactance filter according to claim 1, wherein the means for setting the bandwidth comprises a coil connected in series with a resonator in some of the filter elements.

12. The reactance filter according to claim 1, wherein the filter elements are formed on two substrates having different electromechanical coupling, wherein to set a higher bandwidth for the impedance elements in a filter element the substrate having the higher coupling is selected for the corresponding filter element.

13. The reactance filter according to claim 1, wherein the means for setting the bandwidth comprises a capacitance connected in parallel with a resonator in some of the filter elements.

14. The reactance filter according to claim 1, wherein a number of resonators in the first and third filter elements is the same, and wherein a connection sequence for the resonators of the whole filter is symmetric.

15. A reactance filter using branching technology, the reactance filter comprising:
    a series circuit containing a first filter element, a second filter element and a third filter element,
    wherein each filter element comprises a first impedance element that is connected in series with an impedance element of an adjacent filter element,
    wherein each filter element comprises a second impedance element connected to the first impedance element of that filter,
    wherein the first and/or second impedance element of each filter element comprises a resonator,
    wherein each impedance element has a bandwidth that is expressed by its pole zero distance, and
    wherein the bandwidth of one of the impedance elements in at least one of the filter elements is set to a different value than the bandwidth of at least one of the first or second impedance elements in another of the filter elements, and
    wherein the impedance elements of the second filter element have a lower bandwidth than those of the third filter element.

16. A reactance filter using branching technology, the reactance filter comprising:
    a series circuit containing a first filter element, a second filter element and a third filter element,
    wherein each filter element comprises a first impedance element that is connected in series with an impedance element of an adjacent filter element,
    wherein the first impedance element of each filter element comprises a resonator,
    wherein each first impedance element has a bandwidth that is expressed by its pole zero distance,
    wherein each filter element comprises a means for setting a bandwidth of at least one impedance element thereof, the bandwidth of at least one of the first impedance elements in at least one of the filter elements being set to a different value than the bandwidth of at least one of the first impedance element in another of the filter elements,
    wherein the resonators are acoustic wave resonators,
    wherein the first and third filter elements are disposed on a first chip,
    wherein the second filter element is disposed on a second chip,
    wherein the bandwidth of the impedance elements on the first and second chips is set differently,
    wherein the first and second chips are arranged on a common circuit carrier, wherein the filter elements are connected in series via electrical conductor sections of the circuit carrier, and wherein the first and second chips are packaged together.

17. The reactance filter according to claim 16, wherein the first and second chips differ in at least two parameters, and wherein the parameters are selected from the group consisting of a substrate material, a cutting angle of a piezoelectric material, a material of a dielectric layer and a layer thickness of the dielectric layer that is applied above the filter elements.

18. A reactance filter using branching technology, the reactance filter comprising:
- a series circuit containing a first filter element, a second filter element and a third filter element,
- wherein each filter element comprises a first impedance element that is connected in series with an impedance element of an adjacent filter element,
- wherein the first impedance element of each filter element comprises a resonator,
- wherein each first impedance element has a bandwidth that is expressed by its pole zero distance,
- wherein each filter element comprises a means for setting a bandwidth of at least one impedance element thereof, the bandwidths of at least one of the first impedance elements in at least one of the filter elements being set to a different value than the bandwidth of at least one of the first impedance element in another of the filter elements,
- wherein the resonators of the filter element(s) having a lower bandwidth comprise BAW (bulk acoustic wave) resonators,
- wherein the resonators of the filter elements having a higher bandwidth comprise SAW (surface acoustic wave) resonators, and
- wherein the filter elements are arranged on two different chips.

* * * * *